United States Patent
Lin et al.

(10) Patent No.: US 9,196,500 B2
(45) Date of Patent: Nov. 24, 2015

(54) METHOD FOR MANUFACTURING SEMICONDUCTOR STRUCTURES

(71) Applicant: UNITED MICROELECTRONICS CORP., Hsin-Chu (TW)

(72) Inventors: Ching-Ling Lin, Kaohsiung (TW); Po-Chao Tsao, New Taipei (TW); Chia-Jui Liang, Tainan (TW); Chien-Ting Lin, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 86 days.

(21) Appl. No.: 13/859,720

(22) Filed: Apr. 9, 2013

(65) Prior Publication Data

US 2014/0302677 A1    Oct. 9, 2014

(51) Int. Cl.
| | |
|---|---|
| H01L 21/311 | (2006.01) |
| H01L 21/308 | (2006.01) |
| H01L 21/8234 | (2006.01) |
| H01L 21/8238 | (2006.01) |
| H01L 29/66 | (2006.01) |

(52) U.S. Cl.
CPC .... *H01L 21/3086* (2013.01); *H01L 21/823468* (2013.01); *H01L 21/823864* (2013.01); *H01L 29/66795* (2013.01)

(58) Field of Classification Search
CPC .................. H01L 21/3086; H01L 21/823468; H01L 21/823864
USPC ........................... 438/696, 699, 700, 717, 719
See application file for complete search history.

(56) References Cited

U.S. PATENT DOCUMENTS

| | | |
|---|---|---|
| 6,043,138 A | 3/2000 | Ibok |
| 6,492,073 B1 | 12/2002 | Lin et al. |
| 6,492,216 B1 | 12/2002 | Yeo |
| 6,921,963 B2 | 7/2005 | Krivokapic |
| 7,087,477 B2 | 8/2006 | Fried |
| 7,091,551 B1 | 8/2006 | Anderson |
| 7,247,887 B2 | 7/2007 | King |
| 7,250,658 B2 | 7/2007 | Doris |
| 7,309,626 B2 | 12/2007 | Ieong |
| 7,352,034 B2 | 4/2008 | Booth, Jr. |
| 7,470,570 B2 | 12/2008 | Beintner |
| 7,531,437 B2 | 5/2009 | Brask |
| 7,569,857 B2 | 8/2009 | Simon |
| 7,666,578 B2 | 2/2010 | Fischer et al. |
| 2004/0195624 A1 | 10/2004 | Liu |
| 2005/0051825 A1 | 3/2005 | Fujiwara |
| 2006/0099830 A1 | 5/2006 | Walther |
| 2006/0286729 A1 | 12/2006 | Kavalieros |

(Continued)

OTHER PUBLICATIONS

Chien Ting Lin, "FinFET various device width offering for SIT process", Invention Disclosure, Feb. 14, 2011, p. 1-7.

(Continued)

*Primary Examiner* — Binh X Tran
(74) *Attorney, Agent, or Firm* — Winston Hsu; Scott Margo

(57) ABSTRACT

A method for manufacturing semiconductor structures includes providing a substrate having a plurality of mandrel patterns and a plurality of dummy patterns, simultaneously forming a plurality of first spacers on sidewalls of the mandrel patterns and a plurality of second spacers on sidewalls of the dummy patterns, and removing the second spacers and the mandrel patterns to form a plurality of spacer patterns on the substrate.

19 Claims, 12 Drawing Sheets

(56) References Cited

U.S. PATENT DOCUMENTS

| | | |
|---|---|---|
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0101995 A1 | 4/2009 | Beintner et al. |
| 2009/0124097 A1 | 5/2009 | Cheng |
| 2009/0242964 A1 | 10/2009 | Akil |
| 2009/0263749 A1* | 10/2009 | Sim et al. .................. 430/319 |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2010/0244269 A1* | 9/2010 | Kim ............................. 257/773 |
| 2010/0297852 A1* | 11/2010 | Jung et al. .................. 438/745 |

OTHER PUBLICATIONS

Tsai, Shih-Hung et al., "Partial sidewall image transfer technology for small pitch application", Invention Disclosure, Sep. 9, 2011, p. 1-25.

* cited by examiner

A-A'

METHOD FOR MANUFACTURING SEMICONDUCTOR STRUCTURES

BACKGROUND OF THE INVENTION

1. Field of the Invention

The present invention relates to a method for manufacturing semiconductor structures.

2. Description of the Prior Art

Conventional planar metal-oxide-semiconductor (hereinafter abbreviated as MOS) transistor has difficulty when scaling down to 65 nm and below. Therefore the non-planar transistor technology such as Fin Field effect transistor (FinFET) technology that allows smaller size and higher performance is developed to replace the planar MOS transistor.

Since the manufacturing processes of the FinFET device are easily integrated into the traditional logic device processes, it provides superior process compatibility. More important, since the FinFET device increases the overlapping area between the gate and the substrate, the channel region is more effectively controlled. This therefore reduces drain-induced barrier lowering (DIBL) effect and short channel effect. In addition, the channel region is longer under the same gate length, and thus the current between the source and the drain is increased.

However, the FinFET device still faces many problems. For example, because the fin structures include a thin and slim configuration, it is always difficult to improve process control. There is therefore a continuing need in the semiconductor processing to improve the process control and to obtain the fin structures having desirably expected profile.

SUMMARY OF THE INVENTION

According to an aspect of the present invention, a method for manufacturing semiconductor structures is provided. The method includes providing a substrate having a plurality of mandrel patterns and a plurality of dummy patterns, forming a plurality of first spacers on sidewalls of the mandrel patterns and a plurality of second spacers on sidewalls of the dummy patterns simultaneously, removing the second spacers, and removing the mandrel patterns to form a plurality of spacer patterns on the substrate.

According to another aspect of the present invention, a method for manufacturing semiconductor structures is provided. The method includes providing a substrate having a plurality of mandrel patterns and a plurality of dummy patterns, forming a plurality of insulating patterns on the substrate, the insulating patterns covering portions of each mandrel pattern, performing an etching back process to remove portions of the insulating patterns from tops of each mandrel pattern and removing the mandrel patterns to form a plurality of spacer patterns on the substrate.

The method for manufacturing the semiconductor structures provided by the present invention adopts the spacer image transfer (SIT) approach, that is to form spacer patterns for defining the fin structures on the substrate. It is noteworthy that the method provided by the invention is to form the spacer patterns with non-continuous configuration. Consequently, the semiconductor structures obtained by transferring the non-continuous spacer pattern to the substrate are prevented from collapse. Briefly speaking, according to the method for manufacturing the semiconductor structures provided by the present invention, process control is improved and fin structure with desirable profile are obtained without increasing process difficulty.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A-5 are schematic drawings illustrating a method for manufacturing semiconductor structures provided by a first preferred embodiment of the present invention, wherein FIGS. 1B-4B are cross-sectional views taken along a Line A-A' of FIGS. 1A-4A, respectively.

FIGS. 1A-2B, 4A-5, and 6A-7 are schematic drawings illustrating a method for manufacturing semiconductor structures provided by a second preferred embodiment of the present invention, wherein

FIGS. 1A-1B, 4A-5, and 8A-10B are schematic drawings illustrating a method for manufacturing semiconductor structures provided by a third preferred embodiment of the present invention, wherein FIGS. 8B and 10B are cross-sectional views taken along a Line A-A' of FIGS. 8A and 10A, respectively.

FIGS. 1A-1B, 4A-5, and 11A-12B are schematic drawings illustrating a method for manufacturing semiconductor structures provided by a fourth preferred embodiment of the present invention, wherein FIGS. 11B and 12B are cross-sectional views taken along a Line A-A' of FIGS. 11A and 12A, respectively.

DETAILED DESCRIPTION

Figure 1A:
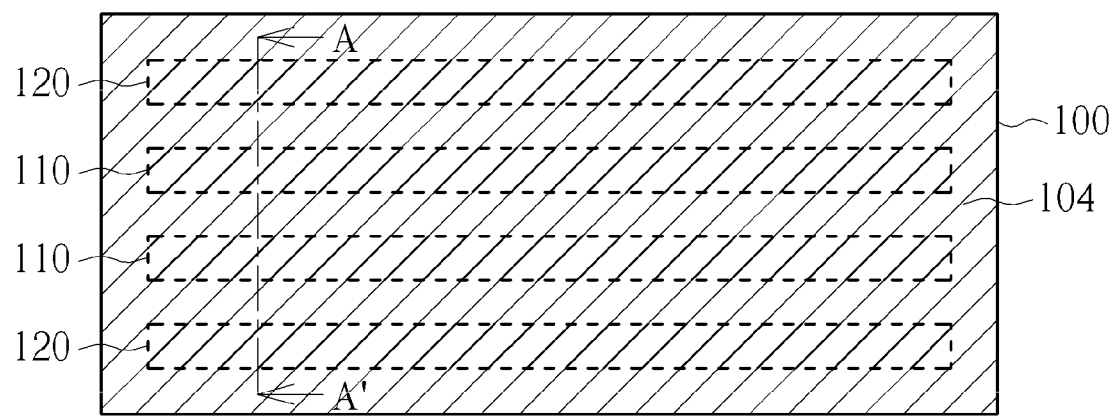
Figure 1B:
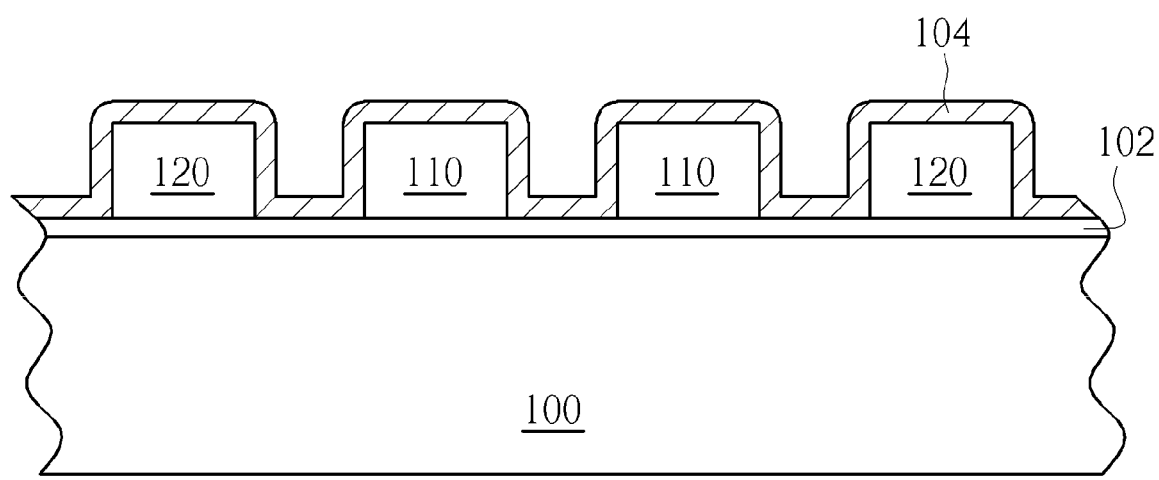

Please refer to FIGS. 1A-5, which are schematic drawings illustrating a method for manufacturing semiconductor structures provided by a first preferred embodiment of the present invention, wherein FIGS. 1B-4B are cross-sectional views taken along a Line A-A' of FIGS. 1A-4A, respectively. As shown in FIGS. 1A and 1B, a substrate 100 is provided. The substrate 100 can include a silicon-on-insulator (SOI) substrate or a bulk silicon substrate. It is well-known to those skilled in the art that a SOI substrate upwardly includes a silicon substrate, a bottom oxide (BOX) layer and a semiconductor layer such as a single crystalline silicon layer. A hard mask layer 102 is then formed on the substrate 100. In the preferred embodiment, the hard mask layer 102 can be a multi-layered structure such as an oxide/nitride/oxide layer, but not limited to this.

Please still refer to FIGS. 1A and 1B. Next, a plurality of mandrel patterns 110 and a plurality of dummy patterns 120 are formed on the substrate 100. The mandrel patterns 110 and the dummy patterns 120 can include semiconductor material such as polysilicon, but not limited to this. A spacing width between each mandrel pattern 110 can be used to define a spacing width between fin structures. Additionally, the dummy patterns 120 are provided to mitigate micro-loading effect. It should be easily realized by those skilled in the art that the sizes, locations and arrangements of the mandrel patterns 110 and the dummy patterns 120 in FIG. 1A are exemplarily provided, and not limited to this. After forming the mandrel patterns 110 and the dummy patterns 120 on the substrate 100, a material layer such as an insulating layer 104, for example but not limited to an atomic layer deposition silicon nitride (ALD-SiN) layer, is blanketly formed on the substrate 100. However, those skilled in the art should understand other suitable material of which an etching rate is different from the mandrel patterns 110 and the dummy patterns 120 can be involved in the preferred embodiment. As shown in FIGS. 1A and 1B, the insulating layer 104 covers the mandrel patterns 110 and the dummy patterns 120.

Figure 2A:
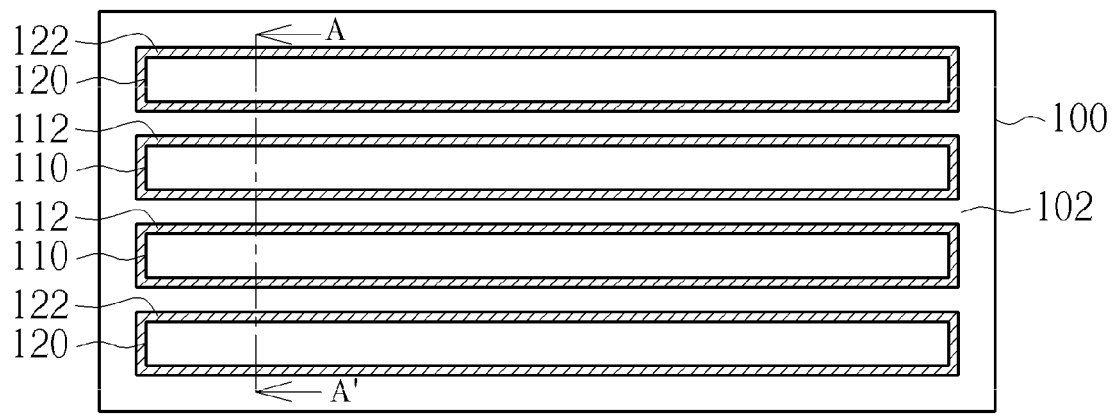
Figure 2B:
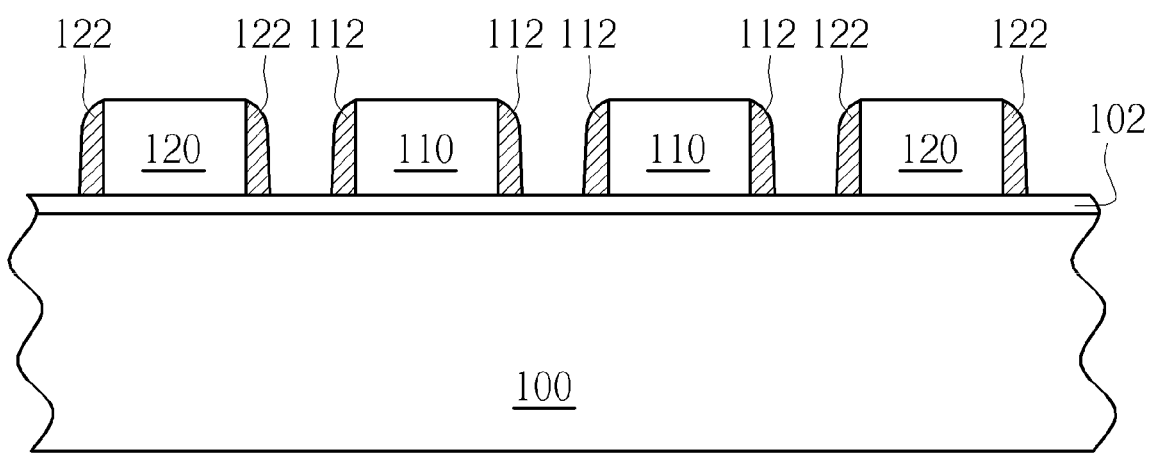

Please refer to FIGS. 2A and 2B. Next, the insulating layer 104 is etched back by, for example but not limited to, a suitable dry etching process and thus a plurality of first spacers 112 are formed on sidewalls of the mandrel patterns 110 and a plurality of second spacers 122 are formed on sidewalls of the dummy patterns 120, simultaneously.

Figure 3A:
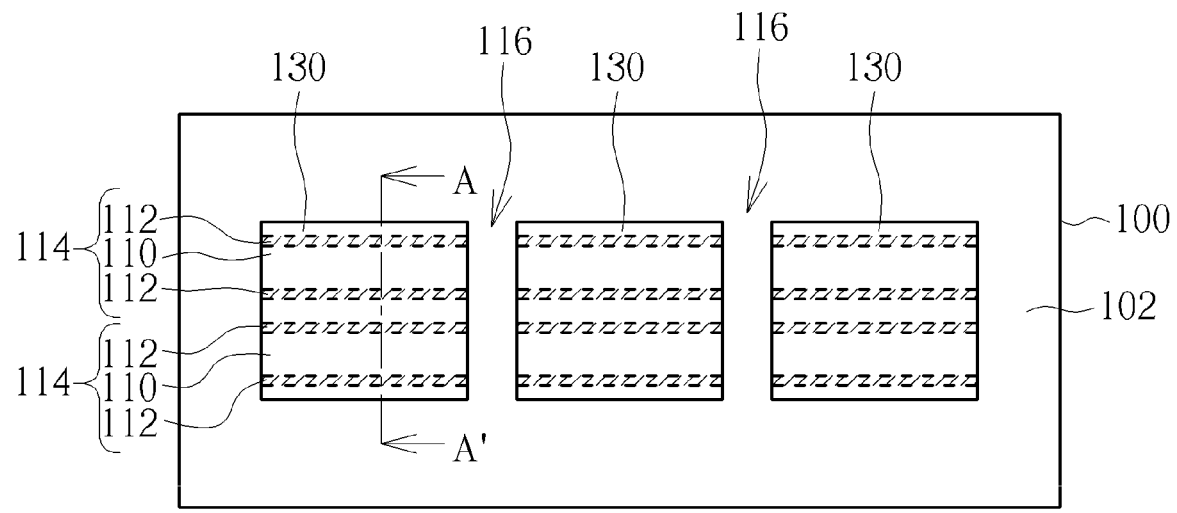
Figure 3B:
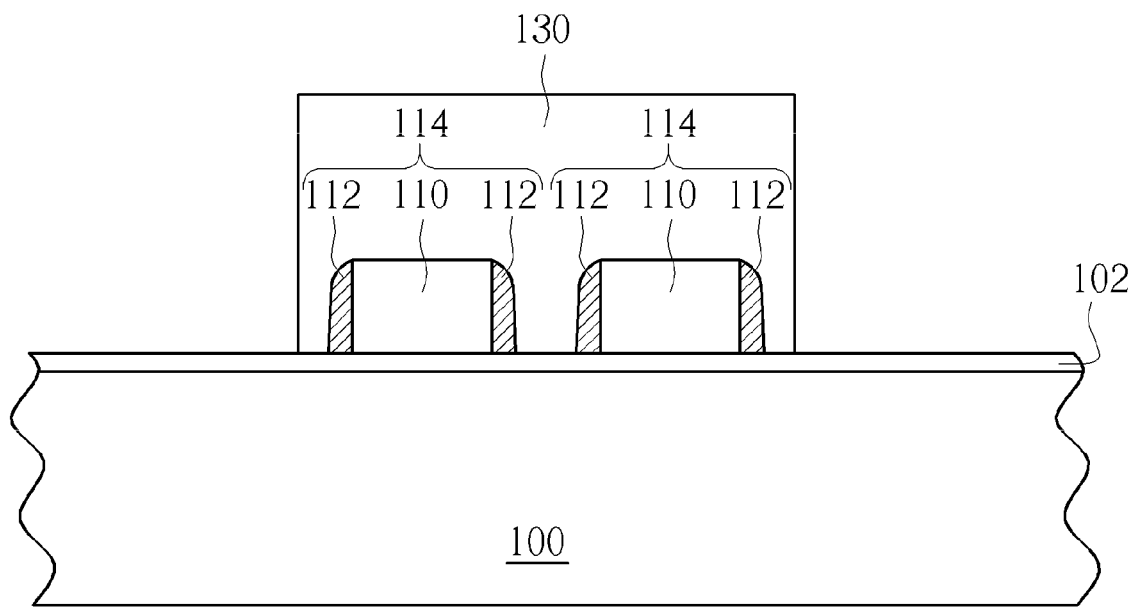

Please refer to FIGS. 3A and 3B. After forming the first spacers 112 and the second spacers 122, protecting layers 130 are formed on the substrate 100. It is noteworthy that the protecting layers 130 cover portions of each mandrel pattern 110 and portions of each first spacer 112. However, the protecting layers 130 expose all of the dummy patterns 120 and the second spacers 122. Subsequently, an etching process is performed to remove the exposed portions of the mandrel patterns 110, the exposed portions of the first spacers 112, all of the dummy patterns 120, and all of the second spacers 122. In other words, the dummy patterns 120 and the second spacers 122 are removed simultaneously with cutting the mandrel patterns 110 and the first spacers 112 according to the preferred embodiment. Consequently, a plurality of section patterns 114 are formed, and the section patterns 114 are spaced apart from each other by gaps 116.

Figure 4A:
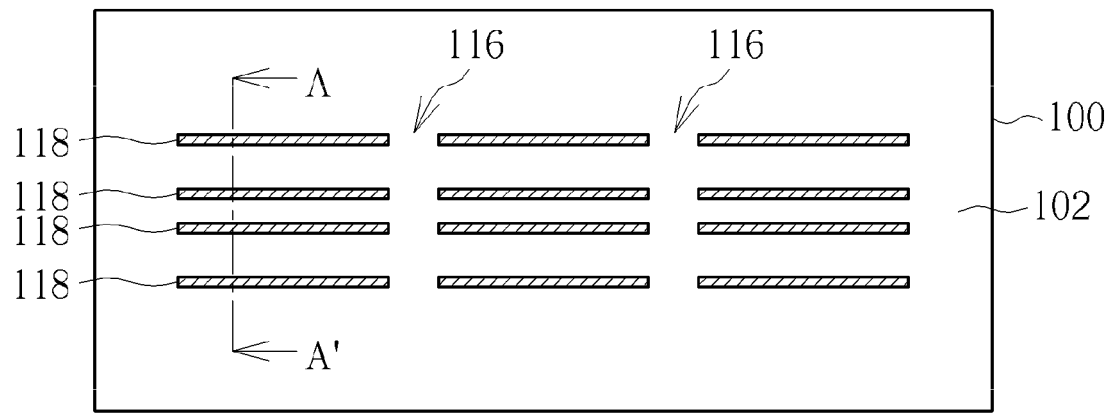
Figure 4B:
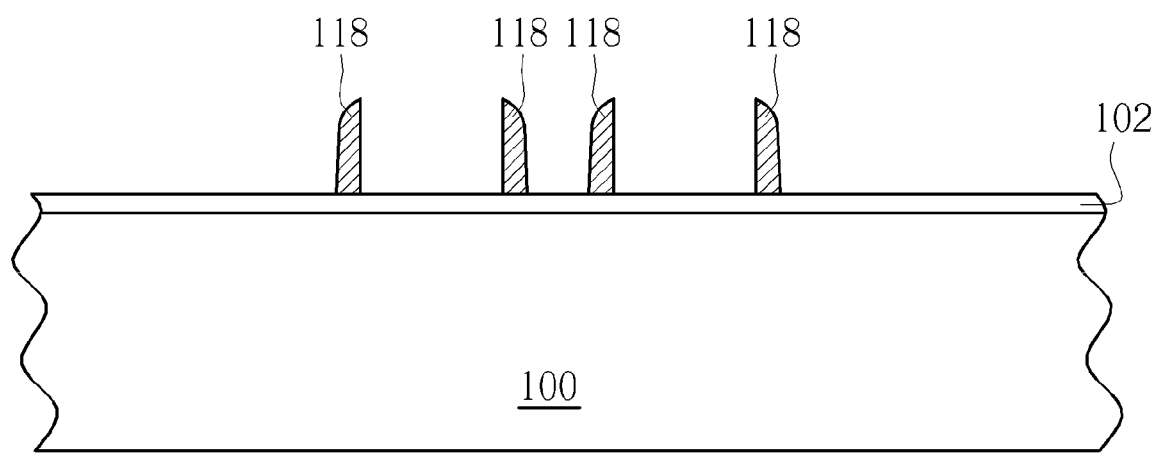

Please refer to FIGS. 4A and 4B. After simultaneously removing the second spacers 122 and the dummy patterns 120, and cutting the mandrel patterns 110 and the first spacers 112, the protecting layers 130 are removed and followed by removing all of the mandrel patterns 110 of the section patterns 114. Consequently, a plurality of spacer patterns 118 are formed on the substrate 100. As mentioned above, the spacer patterns 118 are used to define placement and size of fin structures. Furthermore, the gaps 116 are remained between and used to space apart the spacer patterns 118 as shown in FIG. 4A.

Figure 5:
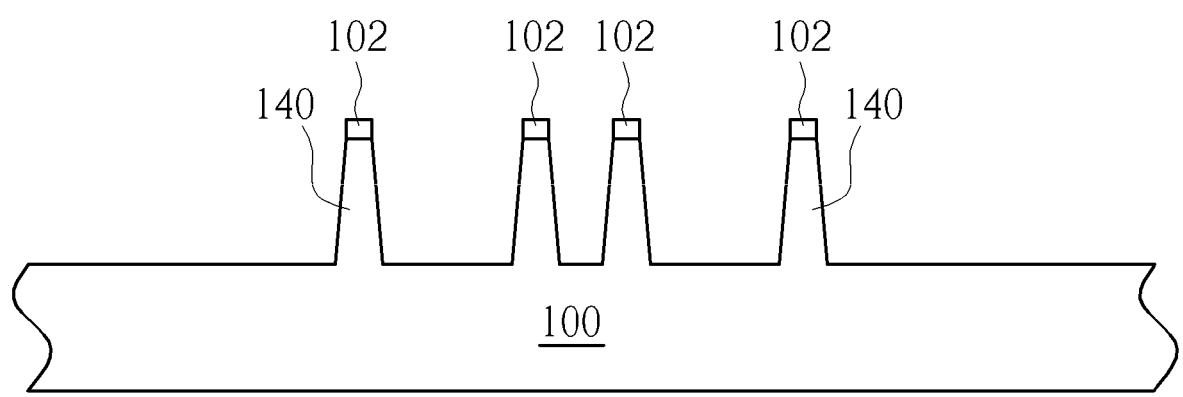

Please refer to FIG. 5. After forming the spacer patterns 118, the hard mask layer 102 is patterned with the spacer patterns 118 serving as a mask. Then, the substrate 100 is etched through the patterned hard mask layer 102 and thus a plurality of semiconductor structures, that is the fin structures 140, are obtained as expected and desired.

According to the method for manufacturing the semiconductor structures provided by the preferred embodiment, the mandrel patterns 110 and the first spacers 112 are cut simultaneously with removing the dummy patterns 120 and the second spacers 122. Therefore, the spacer patterns 118 are obtained to have the expected configuration for the fin structures after removing the mandrel patterns 110. Consequently, the spacer patterns 118 and the following formed fin structures 140 are not that slim and long as those formed in prior art. Therefore, the method for manufacturing the semiconductor structures provided by the preferred embodiment efficaciously improves process control, and fin structures with desirably expected profile are obtained.

Figure 6A:
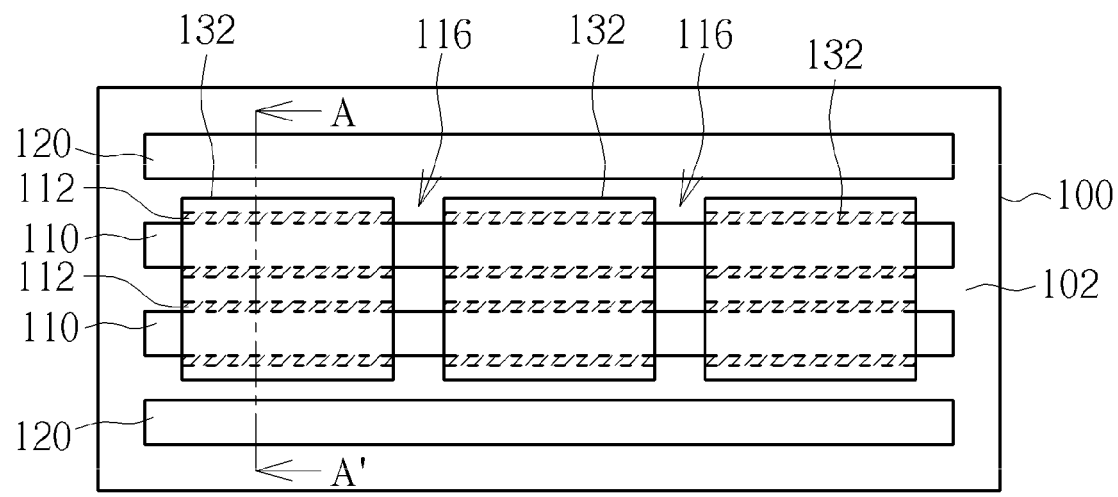
Figure 6B:
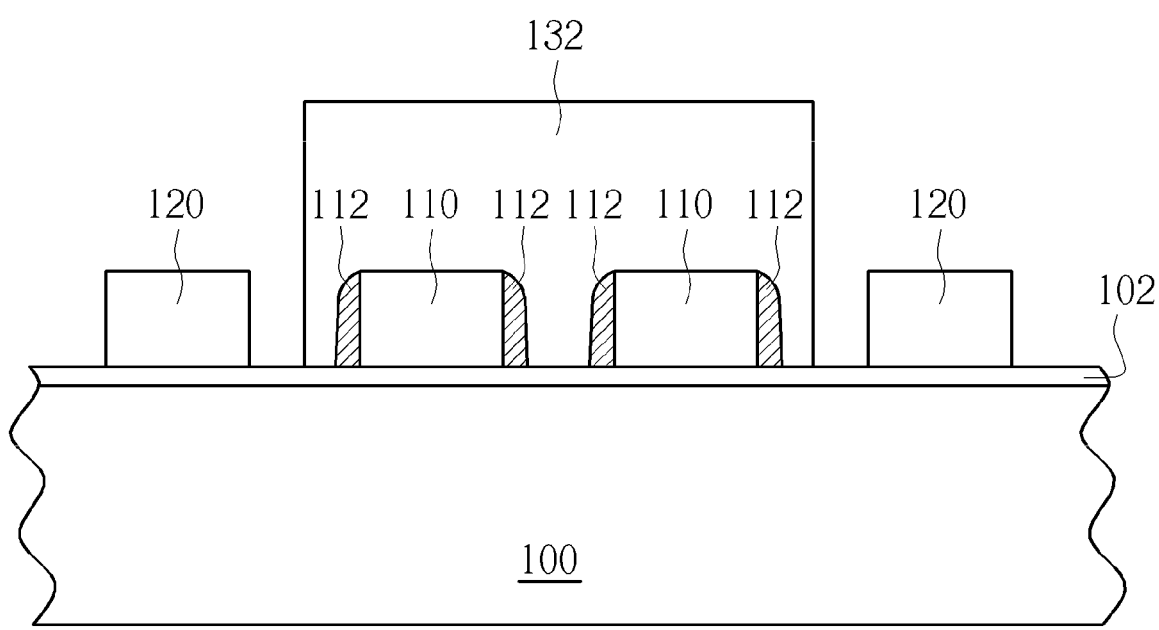
FIG. 6B is a cross-sectional view taken along a Line A-A' of FIG. 6A.

Please refer to FIGS. 1A-2B, 4A-5, and 6A-7, which are schematic drawings illustrating a method for manufacturing semiconductor structures provided by a second preferred embodiment of the present invention, wherein FIG. 6B is a cross-sectional view taken along a Line A-A' of FIG. 6A. It should be noted that elements the same in the first and second preferred embodiments are designated by the same numerals. Also, elements the same in the first and second preferred embodiments can include the same material. Therefore, those details are omitted in the interest of brevity. More important, steps provided by the second preferred embodiment are performed subsequent to FIGS. 1A-2B, therefore, FIG. 1A-2B should be referred in the second preferred embodiment. According to the preferred embodiment, a substrate 100 is provided and a hard mask layer 102 is formed on the substrate 100. As shown in FIGS. 1A and 1B, a plurality of mandrel patterns 110 and a plurality of dummy patterns 120 are then formed on the substrate 100. As shown in FIGS. 2A and 2B, a plurality of first spacers 112 are formed on sidewalls of the mandrel patterns 110 and a plurality of second spacers 122 are formed on sidewalls of the dummy patterns 120, simultaneously.

Please refer to FIGS. 6A and 6B subsequent to FIGS. 2A and 2B. After forming the first spacers 112 and the second spacers 122, protecting layers 132 are formed on the substrate 100. It is noteworthy that the protecting layers 132 portions of each mandrel pattern 110 and portions of each first spacer 112. However, the protecting layers 132 expose all of the dummy patterns 120 and second spacers 122. Next, an etching process is performed to remove the exposed portions of the first spacers 112 and all of the second spacers 122. In other words, the second spacers 122 are removed simultaneously with cutting the first spacers 112 according to the preferred embodiment. Furthermore, the first spacers 112 are spaced apart from each other by gaps 116. Then, the protecting layers 132 are removed, and thus only the dummy patterns 120, the mandrel patterns 110, and the first spacers 112 spaced apart from each other by the gaps 116 are remained on the substrate 100 as shown in FIG. 7.

Figure 7:
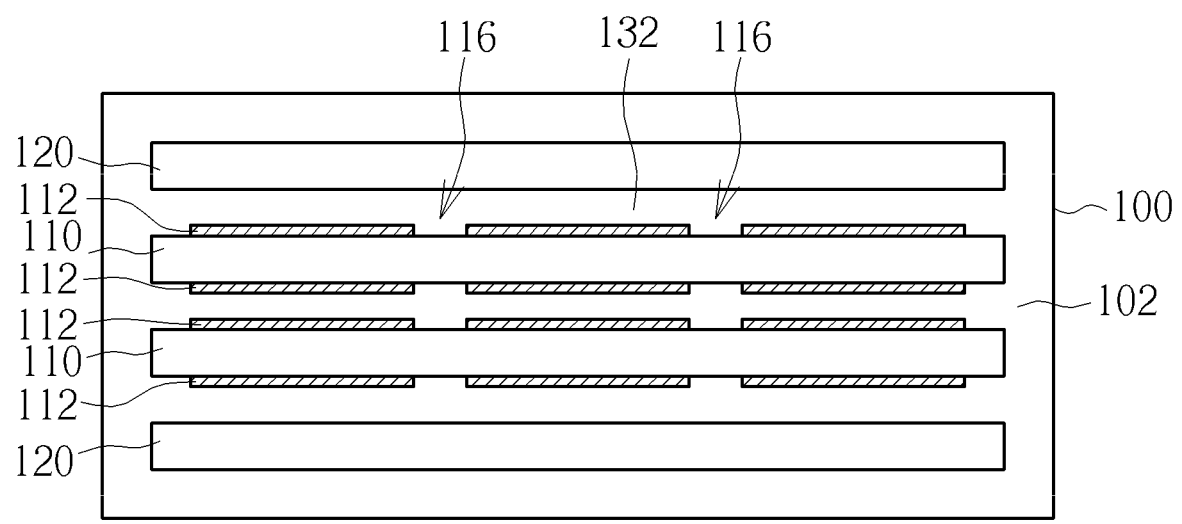

Please refer to FIGS. 4A and 4B subsequent to FIG. 7. After removing the protecting layers 132, the mandrel patterns 110 and the dummy patterns 120 are simultaneously removed from the substrate 100. Consequently, a plurality of spacer patterns 118 are formed on the substrate 100. As mentioned above, the spacer patterns 118 are used to define placement and size of fin structures. Furthermore, the gaps 116 are remained between and used to space apart the spacer patterns 118 in the same row as shown in FIG. 4A. Please refer to FIG. 5. After forming the spacer patterns 118, the hard mask layer 102 is patterned with the spacer patterns 118 serving as a mask. Then, the substrate 100 is etched through the patterned hard mask layer 102 and thus a plurality of semiconductor structures, that is the fin structures 140, are obtained as expected and desired.

According to the method for manufacturing the semiconductor structures of the preferred embodiment, another time point for cutting the first spacers 112 is provided: the first spacers 112 are cut simultaneously with removing the second spacers 122. Therefore, the spacer patterns 118 are obtained to have the expected configuration for the fin structures after removing the mandrel patterns 110. Consequently, the spacer patterns 118 and the following formed fin structures 140 are not that slim and long as those formed in prior art. Therefore, the method for manufacturing the semiconductor structures provided by the preferred embodiment efficaciously improves process control, and fin structures with desirably expected profile are obtained.

Figure 8A:
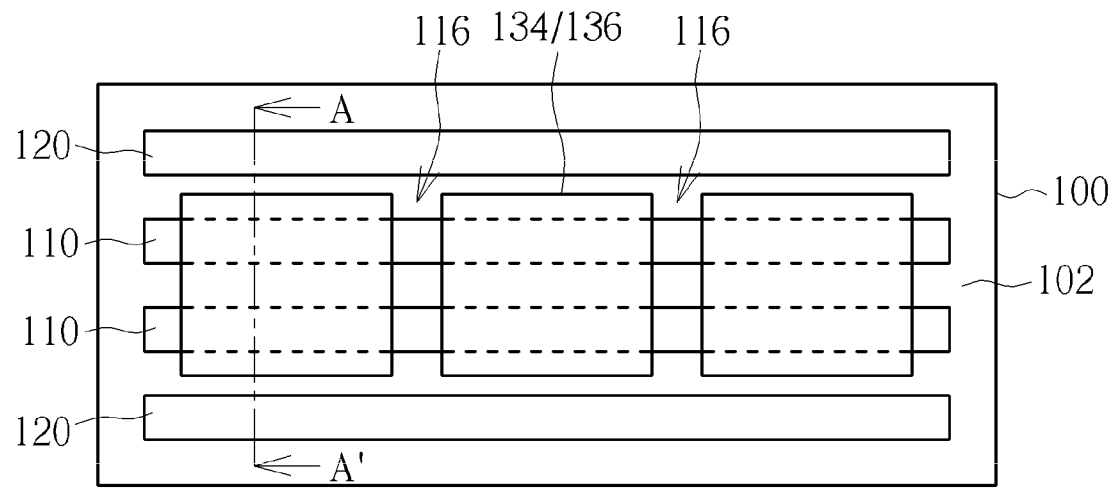
Figure 8B:
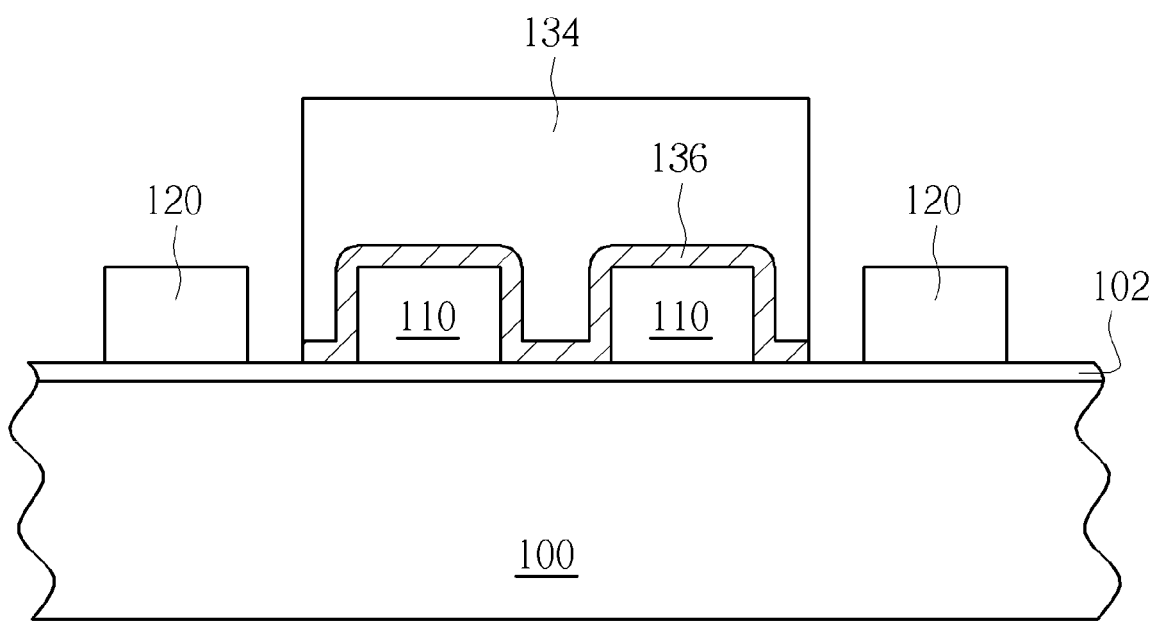
Figure 9:
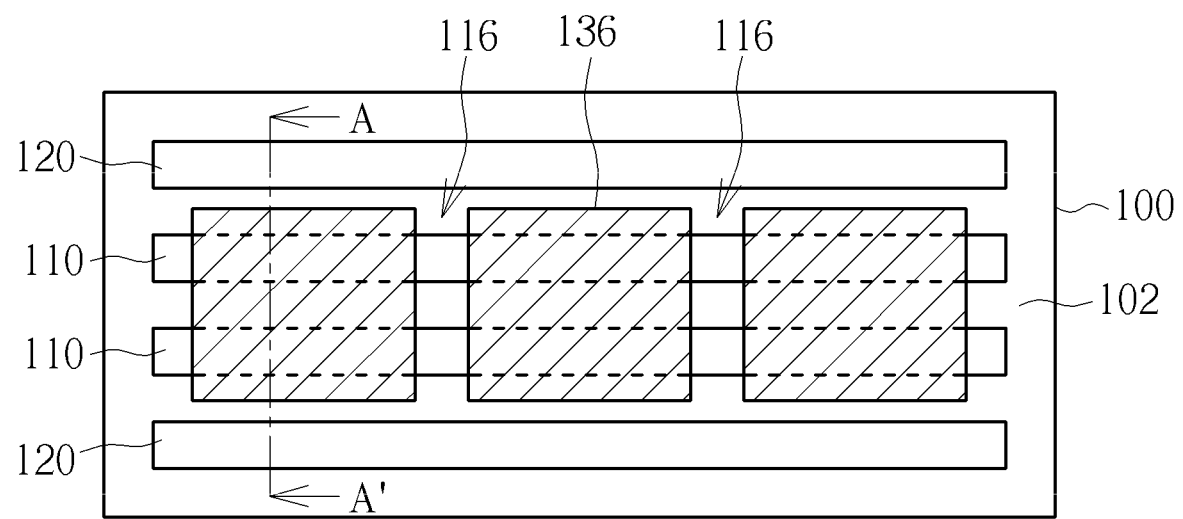
Figure 10A:
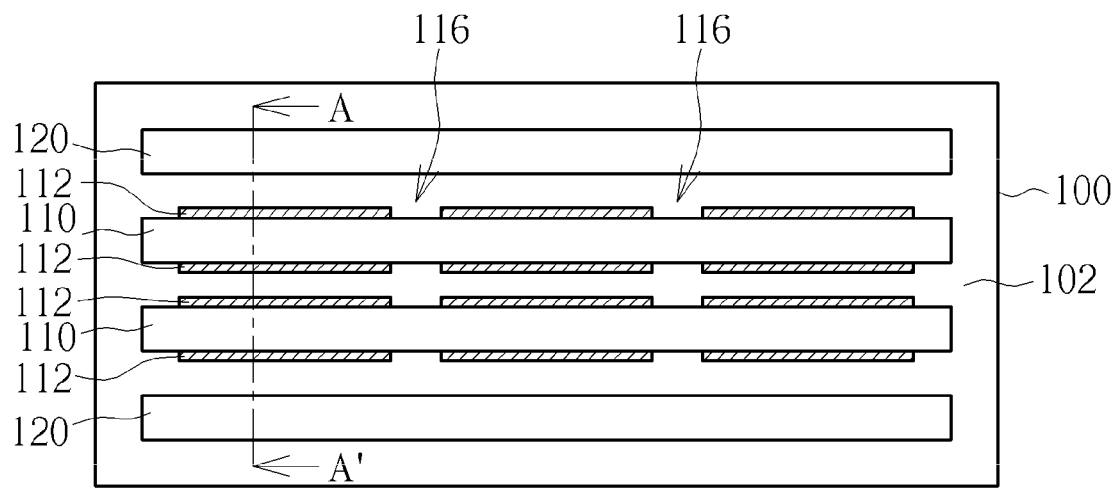
Figure 10B:
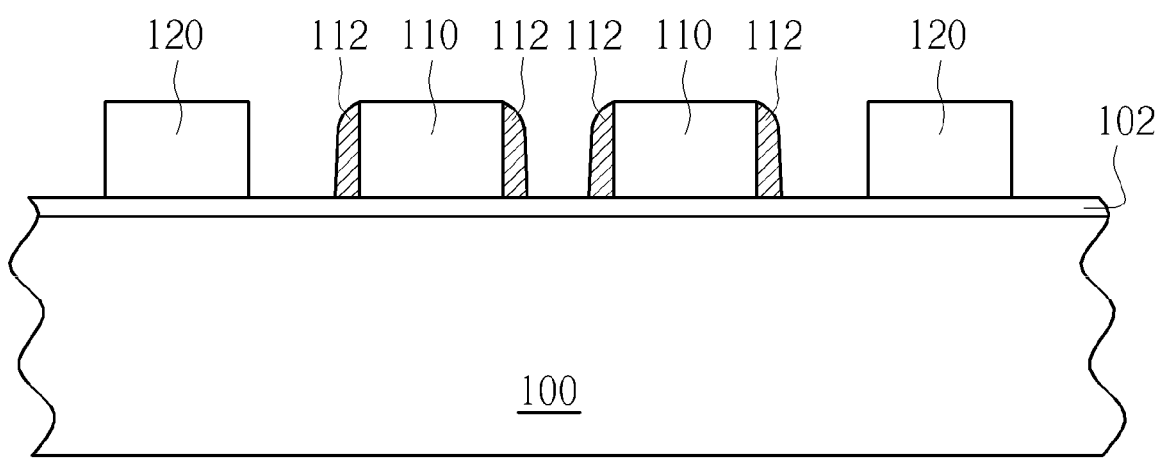

Please refer to FIGS. 1A-1B, 4A-5, and 8A-10B, which are schematic drawings illustrating a method for manufacturing semiconductor structures provided by a third preferred embodiment of the present invention, wherein FIGS. 8B and 10B are cross-sectional views taken along a Line A-A' of FIGS. 8A and 10A, respectively. It should be noted that elements the same in the first, second, and third preferred embodiments are designated by the same numerals. Also, elements the same in the first, second, and third preferred embodiments can include the same material. Therefore, those details are omitted in the interest of brevity. More important, steps provided by the third preferred embodiment are performed subsequent to FIGS. 1A-1B, therefore, FIG. 1A-1B should be referred in the third preferred embodiment. According to the preferred embodiment, a substrate 100 is provided and a hard mask layer 102 is formed on the substrate 100. As shown in FIGS. 1A and 1B, a plurality of mandrel patterns 110 and a plurality of dummy patterns 120 are simultaneously formed on the substrate 100. Then, a material layer, for example but not limited to an insulating layer 104 is formed to cover the mandrel patterns 110 and the dummy patterns 120.

Please refer to FIGS. 8A-8B and 9. Next, protecting layers 134 are formed on the substrate 100. It is noteworthy that the protecting layers 134 are formed correspondingly to the mandrel patterns 110, and the protecting layers 134 in the same row are spaced apart from each other by gaps 116. Subsequently, an etching process is performed to remove the exposed insulating layer 104 and followed by removing the protecting layers 134. Consequently, a plurality of insulating patterns 136 are formed on the substrate 100 as shown in FIG. 9. The insulating patterns 136 cover portions of each mandrel pattern 110. Furthermore, the insulating patterns 136 in the same row are spaced apart from each other by the gaps.

Please refer to FIGS. 10A and 10B. After forming the insulating patterns 136, an etching back process is performed to remove portions of insulating patterns 136 from the top of each mandrel pattern 110. Consequently, a plurality of first spacers 112 are formed on sidewalls of the mandrel patterns 110. As shown in FIG. 10A, the first spacers 112 in the same row are spaced apart from each other by the gaps 116.

Please refer to FIGS. 4A and 4B subsequent to FIGS. 10A and 10B. After forming the first spacers 112, all of the mandrel patterns 110 and the dummy patterns 120 are removed and thus a plurality of spacer patterns 118 are formed on the substrate 100. As mentioned above, the spacer patterns 118 are used to define placement and size of fin structures. Furthermore, the gaps 116 are remained between and used to space apart the spacer patterns 118 in the same row as shown in FIG. 4A. Please refer to FIG. 5. After forming the spacer patterns 118, the hard mask layer 102 is patterned with the spacer patterns 118 serving as a mask. Then, the substrate 100 is etched through the patterned hard mask layer 102 and thus a plurality of semiconductor structures, that is the fin structures 140, are obtained as expected and desired.

According to the method for manufacturing the semiconductor structures of the preferred embodiment, still another time point for cutting the first spacers 112 is provided: the first spacers 112 are cut simultaneously with forming the first spacers 112 itself. Therefore, the spacer patterns 118 are obtained to have the expected configuration for the fin structures after removing the mandrel patterns 110. Consequently, the spacer patterns 118 and the following formed fin structures 140 are not that slim and long as those formed in prior art. Therefore, the method for manufacturing the semiconductor structures provided by the preferred embodiment efficaciously improves process control, and fin structures with desirably expected profile are obtained.

Figure 11A:
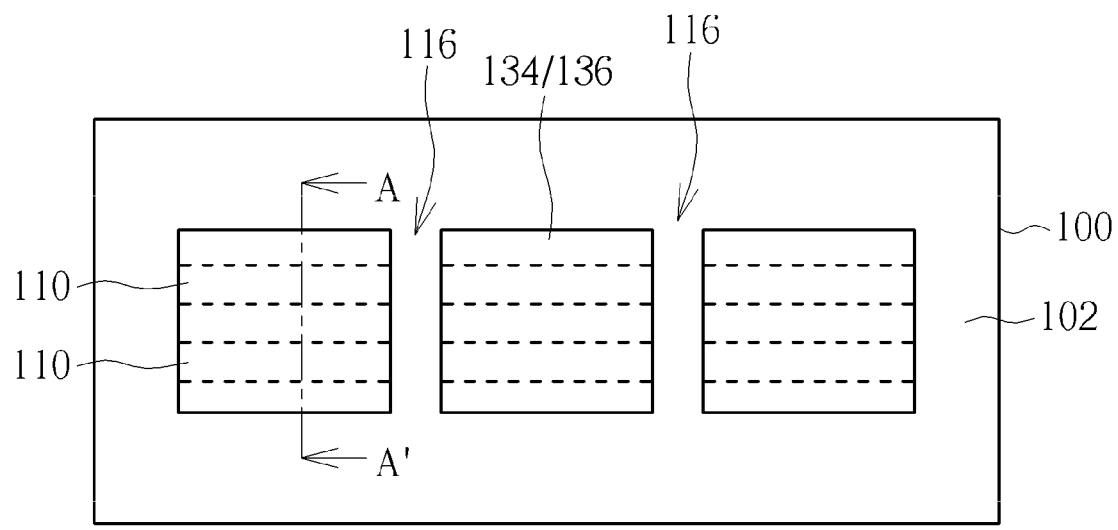
Figure 11B:
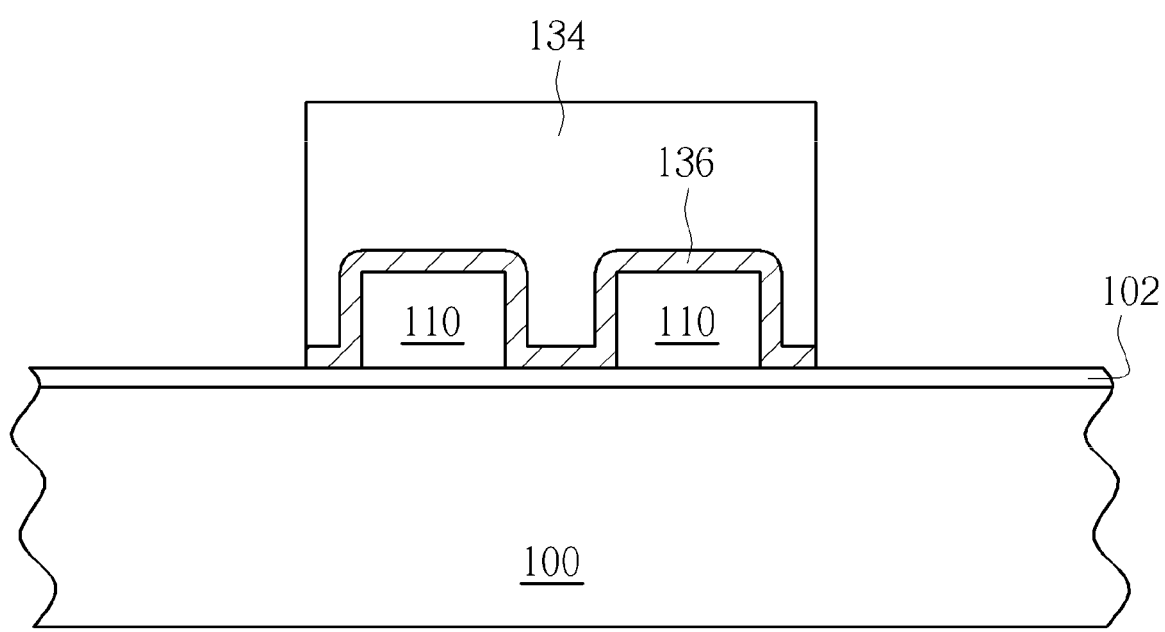
Figure 12A:
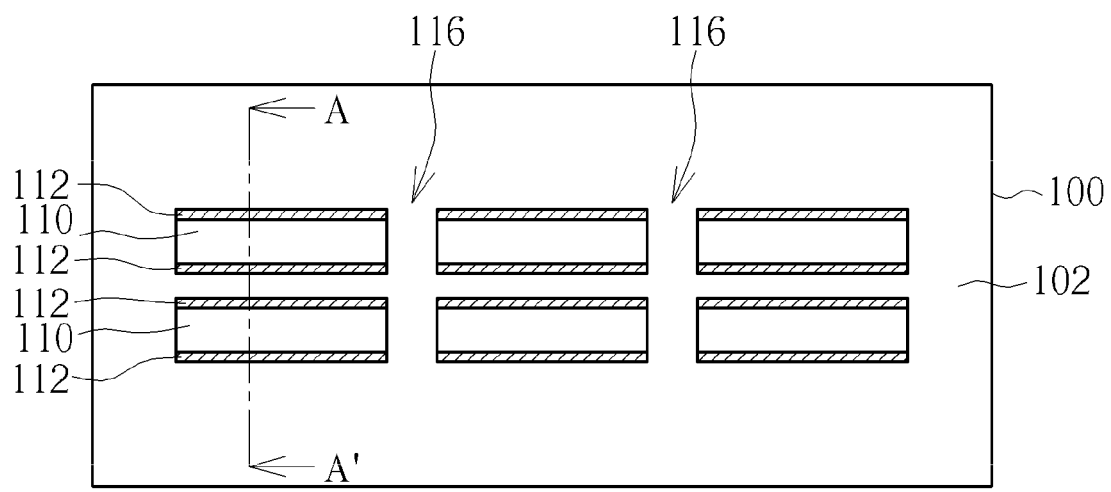
Figure 12B:
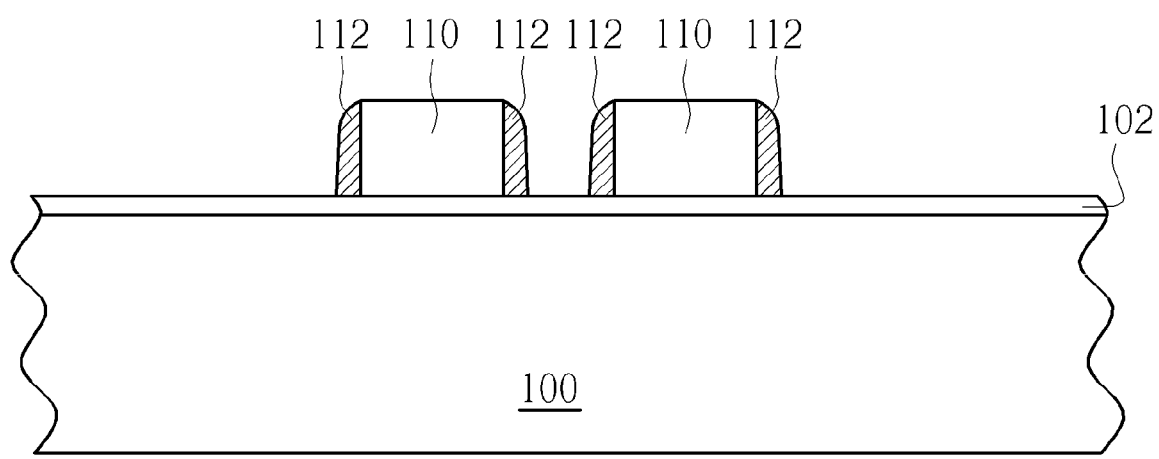

Please refer to FIGS. 1A-1B, 4A-5, and 11A-12B, which are schematic drawings illustrating a method for manufacturing semiconductor structures provided by a fourth preferred embodiment of the present invention, wherein FIGS. 11B and 12B are cross-sectional views taken along a Line A-A' of FIGS. 11A and 12A, respectively. It should be noted that elements the same in the first, second, third, and fourth preferred embodiments are designated by the same numerals. Also, elements the same in the first, second, third, and fourth preferred embodiments can include the same material. Therefore, those details are omitted in the interest of brevity. More important, steps provided by the fourth preferred embodiment are performed subsequent to FIGS. 1A-1B, therefore, FIG. 1A-1B should be referred in the fourth preferred embodiment. According to the preferred embodiment, a substrate 100 is provided and a hard mask layer 102 is formed on the substrate 100. As shown in FIGS. 1A and 1B, a plurality of mandrel patterns 110 and a plurality of dummy patterns 120 are simultaneously formed on the substrate 100. Then, a material layer, for example but not limited to an insulating layer 104 is formed to cover the mandrel patterns 110 and the dummy patterns 120.

Please refer to FIGS. 11A and 11B. Next, protecting layers 134 are formed on the substrate 100. It is noteworthy that the protecting layers 134 are formed correspondingly to the mandrel patterns 110, and the protecting layers 134 in the same row are spaced apart from each other by gaps 116. More important, the protecting layer 134 exposes all of the dummy patterns 120 in the preferred embodiment. Subsequently, an etching process is performed to remove the exposed insulating layer 104 and all of the dummy patterns 120, and followed by removing the protecting layers 134. Consequently, a plurality of insulating patterns 136 are formed and no dummy patterns 120 are left on the substrate 100 as shown in FIG. 9. The insulating patterns 136 cover portions of each mandrel pattern 110. Furthermore, the insulating patterns 136 in the same row are spaced apart from each other by the gaps.

Please refer to FIGS. 12A and 12B. After forming the insulating patterns 136, an etching back process is performed to remove portions of insulating patterns 136 from the top of each mandrel pattern 110. Consequently, a plurality of first spacers 112 are formed on sidewalls of the mandrel patterns 110. As shown in FIG. 10A, the first spacers 112 in the same row are spaced apart from each other by the gaps 116.

Please refer to FIGS. 4A and 4B subsequent to FIGS. 12A and 12B. After forming the first spacers 112, all of the mandrel patterns 110 are removed and thus a plurality of spacer patterns 118 are formed on the substrate 100. As mentioned above, the spacer patterns 118 are used to define placement and size of fin structures. Furthermore, the gaps 116 are remained between and used to space apart the spacer patterns 118 in the same row as shown in FIG. 4A. Please refer to FIG. 5. After forming the spacer patterns 118, the hard mask layer 102 is patterned with the spacer patterns 118 serving as a mask. Then, the substrate 100 is etched through the patterned hard mask layer 102 and thus a plurality of semiconductor structures, that is the fin structures 140, are obtained as expected and desired.

According to the method for manufacturing the semiconductor structures of the preferred embodiment, the dummy patterns 120 are removed simultaneously with cutting the first spacers 112.

Accordingly, the method for manufacturing semiconductor structures provided by the present invention adopts the spacer image transfer (SIT) approach, that is to form spacer patterns for defining the fin structures on the substrate. It is noteworthy that the method provided by the invention is to form the spacer patterns with non-continuous configuration at, at least, three time points: simultaneously with removing the mandrel patterns and the dummy patterns, simultaneously with removing the second spacers, and simultaneously with forming the first spacers itself. Consequently, the semiconductor structures obtained by transferring the non-continuous spacer pattern to the substrate are prevented from collapse. Briefly speaking, according to the method for manufacturing the semiconductor structures provided by the present invention, both process control and process flexibility are improved, and fin structures with desirably expected configuration are obtained without increasing process difficulty.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing semiconductor structures comprising steps of:
    providing a substrate having a plurality of mandrel patterns and a plurality of dummy patterns;
    forming a plurality of first spacers on sidewalls of the mandrel patterns and a plurality of second spacers on sidewalls of the dummy patterns simultaneously;
    forming a protecting layer covering portions of each mandrel pattern and portions of each first spacer and exposing all portion of the dummy patterns and all portion of the second spacers;
    removing the second spacers after forming the protecting layer;
    removing the protecting layer after removing the second spacers; and
    removing the mandrel patterns to form a plurality of spacer patterns on the substrate after removing the protecting layer.

2. The method for manufacturing the semiconductor structures according to claim 1, further comprising removing the dummy patterns simultaneously with removing the second spacers.

3. The method for manufacturing the semiconductor structures according to claim 2, further comprising cutting the mandrel patterns and the first spacers to form a plurality of section patterns simultaneously with removing the second spacers and the dummy patterns.

4. The method for manufacturing the semiconductor structures according to claim 3, wherein the section patterns are spaced apart from each other by a gap.

5. The method for manufacturing the semiconductor structures according to claim 4, wherein the gap remains in between and spaces apart the spacer patterns after removing the mandrel patterns.

6. The method for manufacturing the semiconductor structures according to claim 3, wherein the step of simultaneously removing the second spacers, removing the dummy patterns, and cutting the mandrel patterns and the first spacers is performed before the step of removing the mandrel patterns.

7. The method for manufacturing the semiconductor structures according to claim 1, further comprising removing the dummy patterns simultaneously with removing the mandrel patterns.

8. The method for manufacturing the semiconductor structures according to claim 7, further comprising cutting the first spacers simultaneously with removing the second spacers.

9. The method for manufacturing the semiconductor structures according to claim 8, wherein the first spacers are spaced apart from each other by a gap.

10. The method for manufacturing the semiconductor structures according to claim 9, wherein the gap remains in between and spaces apart the spacer patterns after removing the mandrel patterns and the dummy patterns.

11. The method for manufacturing the semiconductor structures according to claim 8, wherein step of simultaneously removing the second spacers and cutting the mandrel patterns and the first spacers is performing before the step of removing the mandrel patterns and the dummy patterns.

12. The method for manufacturing the semiconductor structures according to claim 1, further comprising a hard mask layer formed between the spacer patterns and the substrate.

13. The method for manufacturing the semiconductor structures according to claim 12, further comprising patterning the hard mask layer and the substrate to form a plurality of semiconductor structures through the spacer patterns.

14. A method for manufacturing semiconductor structures comprising steps of:
    providing a substrate having a plurality of mandrel patterns and a plurality of dummy patterns;
    forming an insulating layer covering tops and sidewalls of the mandrel patterns and the dummy patterns;
    removing the insulating layer from the tops and the sidewalls of the dummy patterns;
    performing an etching back process to remove portions of the insulating layers from the tops of the mandrel patterns to form a plurality of spacers on the sidewalls of the mandrel patterns; and
    removing the mandrel patterns to form a plurality of spacer patterns on the substrate after the etching back process.

15. The method for manufacturing the semiconductor structures according to claim 14, further comprising removing the dummy patterns simultaneously with removing the mandrel patterns after the etching back process.

16. The method for manufacturing the semiconductor structures according to claim 14, further comprising removing the dummy patterns before performing the etching back process.

17. The method for manufacturing the semiconductor structures according to claim 14, wherein the insulating layers are spaced apart from each other by a gap after being removed from the tops and the sidewalls of the dummy patterns, and the gap remains in between and spaces apart the spacer patterns after removing the mandrel patterns.

18. The method for manufacturing the semiconductor structures according to claim 14, further comprising a hard mask layer formed between the spacer patterns and the substrate.

19. The method for manufacturing the semiconductor structures according to claim 18, further comprising patterning the hard mask layer and the substrate to form a plurality of the semiconductor structures through the spacer patterns.

* * * * *